Figure 3:
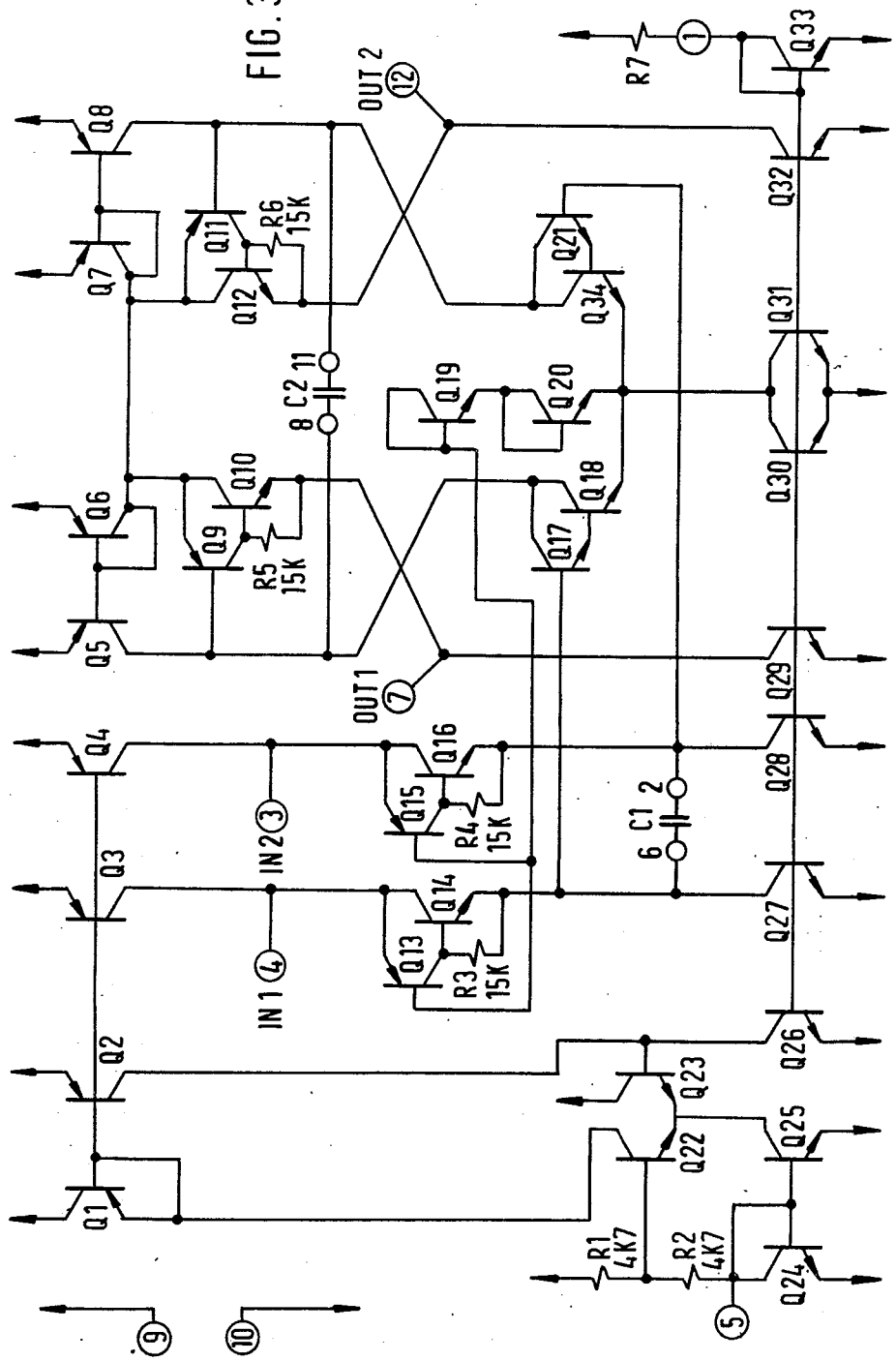

United States Patent [19]

Hamilton

[11] 4,030,043

[45] June 14, 1977

[54] GENERALIZED OPERATIONAL AMPLIFIER

[76] Inventor: Thomas Allan Hamilton, 222 Newkirk Road, Richmond Hill, Ontario, Canada

[22] Filed: Feb. 19, 1975

[21] Appl. No.: 550,911

[30] Foreign Application Priority Data

Feb. 20, 1974 United Kingdom ............... 7761/74

[52] U.S. Cl. .............................. 330/30 D; 330/26; 330/69
[51] Int. Cl.² ......................................... H03F 3/45
[58] Field of Search ................. 330/26, 30 D, 30 R, 330/69

[56] References Cited

UNITED STATES PATENTS 3,042,876  7/1962  Pegram ........................... 330/26 X
3,852,678  12/1974  Frye ............................... 330/22 X Primary Examiner—Rudolph V. Rolinec
Assistant Examiner—Lawrence J. Dahl
Attorney, Agent, or Firm—William F. Frank

[57] ABSTRACT

An operational amplifier is provided with two current outputs instead of the usual one voltage output. The amplifier has two current inputs, ideally zero input impedance and ideally infinite current gain and output impedance.

10 Claims, 12 Drawing Figures

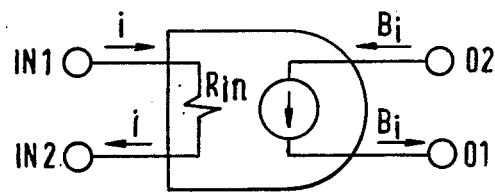
FIG. 1
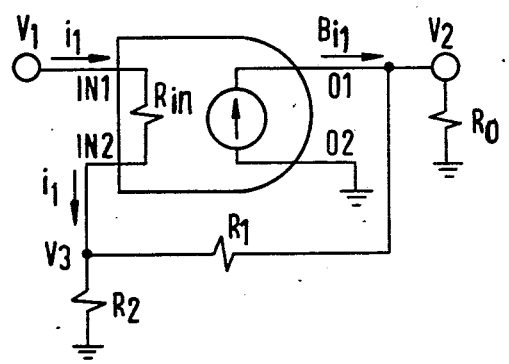
FIG. 2a vcvs
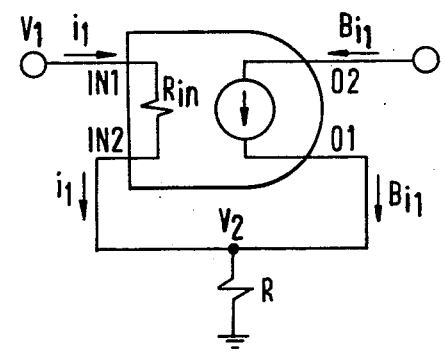
FIG. 2b vccs
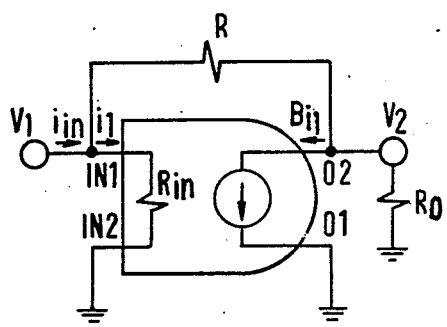
FIG. 2c ccvs
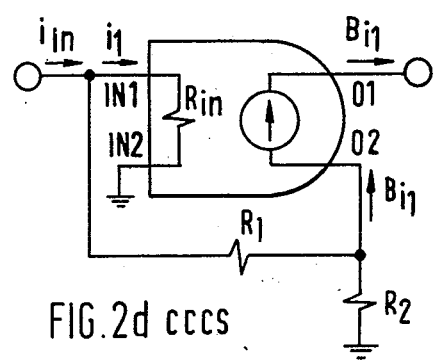
FIG. 2d cccs

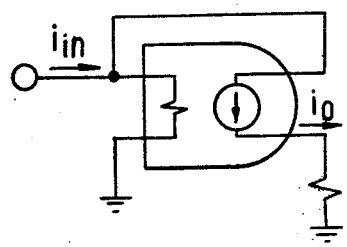
FIG. 4a CURRENT BUFFER (CCCS UNITY GAIN)
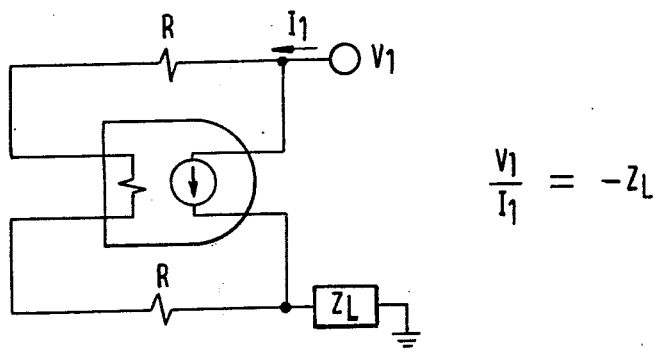
FIG. 4b NEGATIVE IMPEDANCE CONVERTER
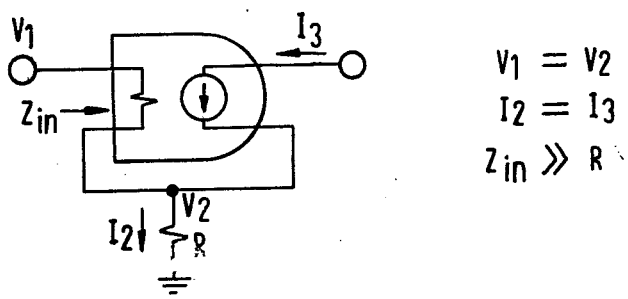
FIG. 4c BUFFER & CURRENT CONVEYOR

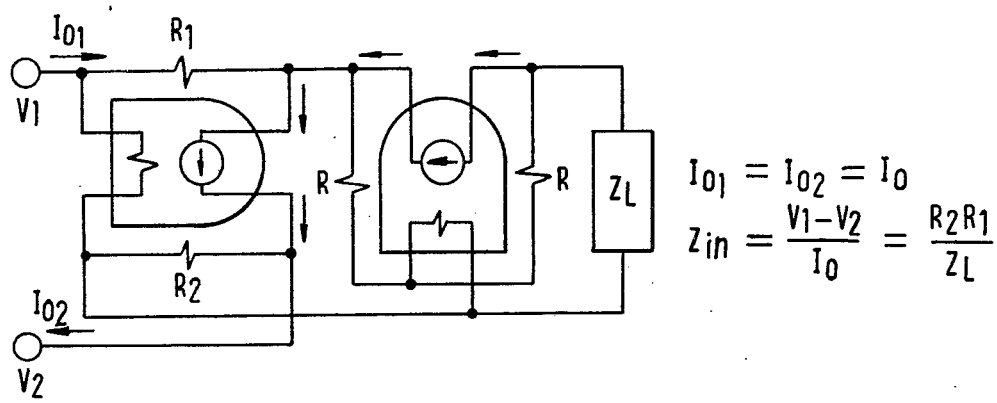
FIG. 4d FLOATING INDUCTOR REALIZATION (PIC)
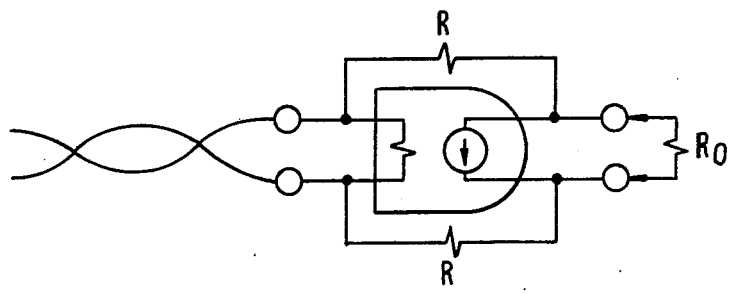
FIG. 4e BALANCED LINE RECEIVER
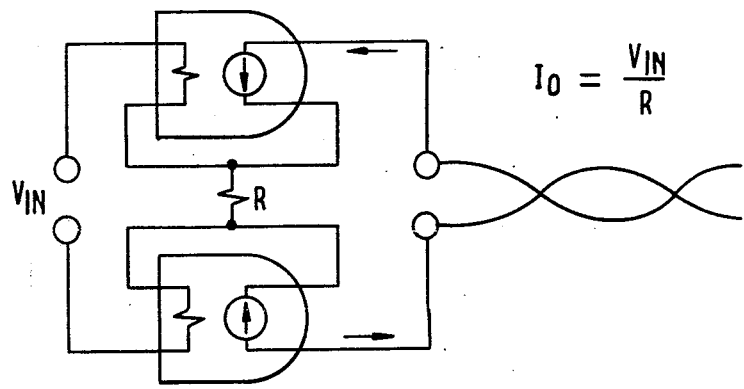
FIG. 4f BALANCED LINE DRIVER

GENERALIZED OPERATIONAL AMPLIFIER

This invention relates to operational amplifiers.

The operational amplifier, in both monolithic and modular form, has become a fundamental building block in systems and circuit design. Inherently a high gain device, the operational amplifier with feedback has been used to implement many useful circuit functions although it has some major limitations. These limitations stem from the fact that the operational amplifier is primarily a voltage device and this fact limits the operational amplifier to voltage output applications. In other words, a single operational amplifier cannot (without much difficulty) synthesize voltage-controlled current sources (VCCS) or current-controlled current sources (CCCS).

It is an object of the invention to improve the operational amplifier so that a single amplifier can synthesize current sources.

According to the invention there is provided an operational amplifier comprising two current inputs exhibiting a low input impedance path for current between them, a high current gain, and two current outputs having a high output impedance path for current between them.

Whereas the conventional operational amplifier has a high, or even infinite, voltage gain, two voltage inputs and at least one voltage output, the amplifier according to the present invention has a high or infinite current gain, two current input and two current outputs. The amplifier of the present invention facilitates the provision of additional outputs of either plurality, and its bandwidth is only limited by the fundamental limitations of the transistors and the output voltage swings, whereas the standard operational amplifier bandwidth is limited by the capacitive effect of the voltage gain. The inputs and outputs of the amplifier according to the present invention can be floating, whereas in the standard amplifier the input and output in general require a ground reference.

An example of the invention will now be described with reference to the accompanying drawings in which:

FIG. 1 is a simple equivalent circuit of an amplifier according to the present invention, FIGS. 2a to 2d represent equivalent circuits of four applications of the amplifier of FIG. 1, FIG. 3 is a schematic circuit diagram on an operational amplifier and FIGS. 4a to 4f show possible circuit applications of the amplifier of FIG. 1.

The amplifier of FIG. 1 has two input terminals, and the impedance $R_{in}$ of the current path between them is low, of the order of zero. The output impedance to current between the output terminals 01 and 02 is high, of the order of infinity, and the open loop current gain B is high, of the order of infinity. Although two output terminals are shown in FIG. 1, additional outputs of either plurality can easily be provided with little or no increase in cost due to the ease of generating matched and tracking currents in the monolithic form of the amplifier.

FIG. 2a illustrates the connections to the amplifier of FIG. 1, hereinafter referred to as GOA, for the generation of a VCVS (Voltage Control Voltage Source). Impedance R1 and R2 are the gain determining resistors while $R_0$ is the load resistor used in determining the output impedance. The three equations describing the VCVS are $$i + \frac{V_2 - V_3}{R_1} = \frac{V_3}{R_2} \quad (1)$$

$$Bi = \frac{V_2}{R_o} + \frac{V_2 - V_3}{R_1} \quad (2)$$

$$V_3 = V_1 - R_{in}i \quad (3)$$

Solution of the above three equations for the voltage transfer function results in $$\frac{V_2}{V_1} = \frac{\left[\frac{B}{B+1}\right]\left[1 + \frac{R_1}{R_2}\right] + \frac{1}{B+1}}{1 + \left[\frac{1}{B+1}\right]\left[\frac{R_{in}}{R_2} + \frac{R_1}{R_o} + \frac{R_{in}}{R_o}\left(1 + \frac{R_1}{R_2}\right)\right]} \quad (4)$$

as the open loop gain B tends to $\infty$ and as the input impedance $R_{in}$ tends to zero, equation (4) then becomes $$\frac{V_2}{V_1} = \left[1 + \frac{R_1}{R_2}\right]$$

which is the usual expression for a positive gain Voltage Controlled Voltage Source.

It remains to examine the input and output impedances of the VCVS to see what has happened to the essentially zero input impedance and high output impedance of our GOA under this type of feedback. The input impedance $Z_{in}$ can be shown to be $$Z_{in} = R_{in} + \frac{[B+1]R_oR_2 + R_1R_2}{R_o + R_1 + R_2} \quad (5)$$

for $R_o = \infty$
$Z_{in} = R_{in} + (B+1)R_2$ which for $R_1$ and $R_2$ of the order of several K ohms and B of greater than 1000 has a magnitude of over 1 Megohm as anticipated. Ideally, with B infinite the input impedance is also infinite.

Equation (4) with the input impedance of the GOA equal to zero becomes $$\frac{V_2}{V_1} = \frac{\left[\frac{B}{B+1}\right]\left[1 + \frac{R_1}{R_2}\right]}{1 + \left[\frac{1}{B+1}\right]\left[\frac{R_1}{R_o}\right]}$$

Examination of this expression results in the output impedance $$Z_o = \left[\frac{R_1}{B+1}\right] \quad (6)$$

For similar values of B an $R_1$ and $R_2$ as before, we see that the output impedance is low (of the order of 1 ohm), as would be expected for a Voltage Controlled voltage Source. Thus, although the ideal input impedance of a GOA is low and the output impedance is infinite, through the use of feedback we have shown that the GOA can realize the required high input impedance and low output impedance of an ideal Voltage Controlled Voltage Source.

FIG. 2b shows the equivalent circuit of a Voltage Control Current Source (VCCS). Such an application is difficult to implement using a standard operational amplifier, but easily implemented with the amplifier of FIG. 1. Analysis of the circuit gives the transadmittance $$\frac{I_o}{V_1} = \frac{I_3}{V_1} = -\frac{B}{R_{in} + (B-1)R} = -\frac{1}{R} \quad (7)$$

which as B tends to infinity gives the required transfer function. Note that in this case the polarity of $I_3$ is negative. However, because of the ease of generating matched, tracking current sources the generation of an output current of the other polarity can be simply implemented.

An examination of the input impedance of the device gives $$Z_{in} = R_{in} + (B+1)R \quad (8)$$

which as before can be shown to be very high. The output impedance of the VCCS is that of a current source and is very high. It is interesting to note that in this mode the GOA gives a true realization of the current conveyor.

FIG. 2c is an equivalent circuit for the Current Control Voltage Source (CCVS) application of the amplifier of FIG. 1. This application is realizable with the standard operational amplifier, since the additional output terminal of the amplifier of FIG. 1 is not used.

Analysis of the circuit gives the transfer function $$\frac{V_2}{L_1} = \frac{\left[\frac{B}{B+1}\right]R - \frac{R_{in}}{B+1}}{1 + \frac{R + R_{in}}{(B+1)R_o}} \quad (9)$$

which under the conditions of zero input impedance and infinite load impedance and loop gain becomes $$V_2/i_1 = -R$$

Examination of the input impedance gives $$Z_{in} = \frac{R \, R_{in}}{(B+1)(R + R_{in})} \quad (10)$$

which tends to zero as the input impedance tends to zero and as B tends to infinity.

FIG. 2d is the equivalent circuit of the Current Control Current source (CCCS) application of the amplifier of FIG. 1. This application cannot be realized by an operational amplifier with a single output, since two outputs are required.

Analysis of the circuit gives the current transfer function $$\frac{I_o}{I_1} = \frac{\left[1 + \frac{R_1}{R_2}\right]}{1 + \frac{1}{B}\left[1 + \frac{R_1}{R_2} + \frac{R_{in}}{R_2}\right]} \quad (11)$$

which as B tends to infinity and input resistance tends to zero becomes $$\frac{I_o}{I_1} = 1 + \frac{R_1}{R_2}$$

The output impedance is that of a current source and is therefore very high.

Since the operational amplifier of FIG. 1 requires current gain and not voltage gain, if the voltage swings are kept low, the major limitation is bandwidth come from the fundamental transistor frequency limitations in the amplifier, as opposed to Miller feedback capacitance limitations inherent in the voltage type amplifier. Gilbert has shown that certain classes of current amplifiers can have bandwidths approaching 500 MHz (see B. Gilbert—"A New Wide Band Amplifier Technique"—"IEEE Journal of Solid State Circuits," Vol. SC3, No. 4, December 1968, pp. 353–365). When the amplifier of FIG. 1 is built in monolithic form, it is easy to generate tracking and matched current sources, so that additional tracking outputs can easily be generated which enable greater versatility of application with almost no increase in cost, apart from providing extra pins on the IC package.

In the circuit of FIG. 3, a pair of composite PNP transistors Q13 and Q14 and Q15 and Q16 are used in differential common base mode to provide low differential input impedance, differential current input and differential current output to further gain stages. The inputs are connected to the emitters of the PNP transistors, and the outputs are from their collectors. The bases of these transistors are biased with diode connected transistors Q19 and Q20. The PNP input pair float between the upper and lower current sources and generate two equal and opposite signal currents ready for further application.

These signal currents are then passed on into a current gain stage consisting of Darlington connected transistors Q17 and 18 and Q21 and 34 which are, in addition, connected as a differential pair. This connection gives a current amplification by the Betas of the Darlington pairs. The outputs of this combined input and gain stage are two differential currents in the collectors of the Darlingtons which are then passed to an output stage with further current amplification.

The output stage operates in a manner very similar to that in the commercially available OPERATIONAL TRANSCONDUCTANCE AMPLIFIER. This section consists of transistors Q5 through Q12. The circuit gives a differential current amplification by the Beta of the composite PNP pairs Q9 and 10 and Q11 and 12 and is also a pair of current mirrors to invert the now highly amplified current signals and presents them at the outputs as required.

In order to achieve low current offset at the input terminals, and improve DC stability, some additional circuitry has been provided to match the upper and lower current sources in the input stage. This consists primarily of a differential pair Q22 and Q23 together with Q1, Q2 and Q26 in a feedback loop which equalize the currents between the upper and lower current source circuits. This connection matches currents in Q2 and Q26 and by virtue of the matching achievable on a monolithic circuit, matches currents in Q3 and Q4, and Q27 and Q28. Overall DC bias is provided by a single external resistor setting up current in diode connected transistor Q33. In our prototype, the value of R7 was of the order of 60K ohms giving total quiescent current of approximately 2 Ma with a power supply of ±10 Volts. At this biasing level, the open loop current gain was of the order of 5,000. Because of the newness of the device, little work has been done in the area of optimized frequency compensation. In addition, the actual strays and parasitics added in the final monolithic implementation could effect any results that were achieved in prototype work. However, some preliminary work has shown that there are two prime areas where frequency compensation capacitors have some good effects and these points have been brought out and are shown on the schematic as C1 and C2. For basic testing of the prototype, the unit was over-compensated and yet still showed bandwidths in excess of 2 MHz in all of its controlled source realizations with load impedances from 1K ohm to 10K ohms. (some frequency response peaking was found in some of the realizations).

FIGS. 4a to 4f show some further applications of the amplifier of FIG. 1, which are believed to require no additional explanation besides the information given in the Figures.

What is claimed is:

1. An operational amplifier comprising an input stage of first and second differential current inputs having a low input impedance connected between said inputs, a high current gain stage, an output stage of at least first and second differential current outputs, each output having at least one of each polarity and a high output impedance connected between said first and said second differential current outputs, said high current gain stage being interposed between said input stage and said output stage and connected to each.

2. An amplifier as claimed in claim 1 wherein each of said differential inputs comprises a pair of composite transistors in a differential common base mode.

3. An amplifier as claimed in claim 2 wherein said high current gain stage is connected to the output of the said composite transistors, said stage comprising Darlington connected transistors, connected as a differential pair.

4. An amplifier as claimed in claim 2 comprising means for matching terminals of said differential inputs, said means comprising transistors in a feedback loop around said composite transistors which equalize the currents between the said terminals.

5. An amplifier as claimed in claim 1 further comprising a resistive feedback circuit between said first differential current output and said second differential current input, a resistive load in the circuit of said second differential current input and a load resistor in the circuit of said first differential current output to provide a voltage controlled voltage source.

6. An amplifier as claimed in claim 1 comprising a common resistive load in a circuit connecting the said second differential current input and the said first differential current output to provide a voltage controlled current source.

7. An amplifier as claimed in claim 1 comprising a resistive feedback circuit connected between the said second differential current output and the said first differential current input and a resistive load in the output circuit of the said second differential current output to provide a current controlled voltage source.

8. An amplifier as claimed in claim 1 comprising a resistive feedback circuit connected between the said first differential current input and the said second differential current output and a resistive load in the circuit of the said second differential current output to provide a current controlled current source.

9. An amplifier as claimed in claim 1 wherein at least one of said differential current inputs is ungrounded.

10. An operational amplifier comprising an input stage of first and second differential current inputs having a low input impedance connected betweeen said inputs, a high current gain stage, an output stage of at least first and second differential current outputs, each output having at least one of each polarity and a high output impedance connected between said first and second differential current outputs, said high current gain stage being interposed between said input stage and said output stage and connected to each; each of said differential inputs comprising a pair of composite transistors in a differential common base mode; said high current gain stage being connected to the output of said composite transistors; said high current gain stage comprising Darlington connected transistors connected as a differential pair; and further comprising means for matching terminals of said differential inputs, said means comprising transistors in a feedback loop around said composite transistors which equalize the currents between the said terminals.

* * * * *